(12) United States Patent
Yoo et al.

(10) Patent No.: US 11,871,608 B2
(45) Date of Patent: Jan. 9, 2024

(54) DISPLAY DEVICE

(71) Applicant: Samsung Display Co., Ltd., Yongin-si (KR)

(72) Inventors: Byunghan Yoo, Yongin-si (KR); Geebum Kim, Yongin-si (KR); Sangwoo Kim, Yongin-si (KR); Chaungi Choi, Yongin-si (KR); Jungha Son, Yongin-si (KR); Taekyung Ahn, Yongin-si (KR); Kijune Lee, Yongin-si (KR); Jaeik Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 400 days.

(21) Appl. No.: 17/417,422

(22) PCT Filed: Oct. 14, 2019

(86) PCT No.: PCT/KR2019/013432
§ 371 (c)(1),
(2) Date: Jun. 23, 2021

(87) PCT Pub. No.: WO2020/138665
PCT Pub. Date: Jul. 2, 2020

(65) Prior Publication Data
US 2022/0085331 A1 Mar. 17, 2022

(30) Foreign Application Priority Data
Dec. 27, 2018 (KR) .......................... 10-2018-0171135

(51) Int. Cl.
*H10K 50/85* (2023.01)
*H10K 59/00* (2023.01)

(52) U.S. Cl.
CPC ............. *H10K 50/85* (2023.02); *H10K 59/00* (2023.02)

(58) Field of Classification Search
CPC ...... H10K 50/85; H10K 59/00; H10K 50/858; H10K 59/122
See application file for complete search history.

(56) References Cited

U.S. PATENT DOCUMENTS 8,226,256 B2   7/2012   Urabe et al.
8,287,159 B2   10/2012  Kato
(Continued)

FOREIGN PATENT DOCUMENTS

| CN | 107845668 | 3/2018 |
| JP | 2002-299044 | 10/2002 |

(Continued)

OTHER PUBLICATIONS

International Search Report dated Jan. 15, 2020, issued in PCT/KR2019/013432 (with English Translation).
(Continued)

*Primary Examiner* — Jonathan Han
(74) *Attorney, Agent, or Firm* — H.C. Park & Associates, PLC

(57) ABSTRACT

A display device having an improved light-extraction efficiency and a reduced color sense variation according to a viewing angle includes a pixel electrode on a substrate, an insulating layer defining an emission area via an opening that covers edges of the pixel electrode and exposes a center portion of the pixel electrode, a first light extraction pattern on the pixel electrode, the first light extraction pattern having a side surface inclined at a first angle, and a second light extraction pattern surrounding the first light extraction pattern on an outer portion of the first light extraction pattern, the second light extraction pattern having a side surface inclined at a second angle that is less than the first angle.

27 Claims, 11 Drawing Sheets

(56) References Cited

U.S. PATENT DOCUMENTS

| | | | |
|---|---|---|---|
| 9,105,855 | B2 | 8/2015 | Ikeda et al. |
| 9,331,309 | B2 | 5/2016 | Kudo et al. |
| 9,774,011 | B2 * | 9/2017 | Choi .................... H10K 50/858 |
| 10,374,197 | B2 | 8/2019 | Kim et al. |
| 10,483,335 | B2 | 11/2019 | Bang et al. |
| 10,622,585 | B2 | 4/2020 | Kim et al. |
| 10,727,450 | B2 | 7/2020 | Yun et al. |
| 10,734,611 | B2 | 8/2020 | Lim et al. |
| 11,251,232 | B2 | 2/2022 | He et al. |
| 2004/0080264 | A1 | 4/2004 | Ichikawa |
| 2012/0133575 | A1 * | 5/2012 | Hasegawa ............ H10K 50/852 345/76 |
| 2013/0076236 | A1 * | 3/2013 | Sumida ................ H10K 50/858 313/504 |
| 2015/0179978 | A1 | 6/2015 | Sato |
| 2016/0087245 | A1 | 3/2016 | Park et al. |

FOREIGN PATENT DOCUMENTS

| | | |
|---|---|---|
| JP | 2004-020746 | 1/2004 |
| JP | 2004-205849 | 7/2004 |
| JP | 2007-248484 | 9/2007 |
| JP | 2010-123450 | 6/2010 |
| JP | 2010-244848 | 10/2010 |
| JP | 2019-175619 | 10/2019 |
| KR | 10-2016-0034457 | 3/2016 |
| KR | 10-2016-0108008 | 9/2016 |
| KR | 10-2017-0052467 | 5/2017 |
| KR | 10-1755770 | 7/2017 |
| KR | 10-2018-0035987 | 4/2018 |
| KR | 10-2018-0065068 | 6/2018 |
| KR | 10-2018-0076429 | 7/2018 |
| KR | 10-2018-0078657 | 7/2018 |

OTHER PUBLICATIONS

Office Action dated Jun. 27, 2023, issued to Japanese Patent Application No. 2021-537113.

* cited by examiner

DISPLAY DEVICE

CROSS REFERENCE TO RELATED APPLICATION

This application is the National Stage Entry of International Application No. PCT/KR2019/013432, filed on Oct. 14, 2019, and which claims priority from and the benefit of Korean Patent Application No. 10-2018/0171135, filed on Dec. 27, 2018, each of which is incorporated by reference for all purposes as if fully set forth herein.

DISCUSSION OF THE BACKGROUND

One or more embodiments relate to a display device, and more particularly, to a display device having improved light extraction efficiency and reduced color sense variation according to a viewing angle.

Among display devices, organic light-emitting display devices have been highlighted as next-generation display devices due to their wide viewing angles, high contrast, and fast response speeds.

In general, an organic light-emitting display device is formed with thin-film transistors and organic light-emitting devices arranged on a substrate, and operates through the organic light-emitting devices which emit light by themselves. An organic light-emitting display device may be used as a display in a small-sized product such as a mobile phone, or a display in a large-sized product such as a television.

An organic light-emitting display device has an organic light-emitting device including an intermediate layer between a pixel electrode and an opposite electrode as each (sub-) pixel, wherein the intermediate layer includes an emission layer. An organic light-emitting display device generally controls light-emission or a light-emitting degree from each pixel via a thin-film transistor electrically connected to a pixel electrode, and an opposite electrode is integrally provided throughout a plurality of (sub-)pixels.

However, according to the display device of the related art, as the display device becomes larger, a light-extraction efficiency of each (sub-)pixel degrades, and it is difficult to control a color sense variation according to a viewing angle.

One or more embodiments include a display device having an improved light-extraction efficiency and reduced color sense variation according to a viewing angle. However, the above technical features are exemplary, and the scope of the disclosure is not limited thereto.

SUMMARY

According to an embodiment, a display device includes a pixel electrode on a substrate; an insulating layer defining an emission area via an opening that covers edges of the pixel electrode and exposes a center portion of the pixel electrode; a first light extraction pattern on the pixel electrode, the first light extraction pattern having a side surface inclined at a first angle; and a second light extraction pattern surrounding the first light extraction pattern on an outer portion of the first light extraction pattern, the second light extraction pattern having a side surface inclined at a second angle that is less than the first angle.

The display device may include a planarization layer covering the first light extraction pattern and the second light extraction pattern.

The first light extraction pattern and the second light extraction pattern may have a first refractive index, and the planarization layer may have a second refractive index that is greater than the first refractive index.

The first light extraction pattern, the second light extraction pattern, and the planarization layer may include a light-transmitting organic material.

The planarization layer may include fine particles including an inorganic material.

The second light extraction pattern may have a second height and the first light extraction pattern may have a first height that is less than the second height.

The first light extraction pattern may have a first height and the second light extraction pattern may have a second height that is equal to the first height.

The first light extraction pattern may be on the opening to correspond to the emission area.

The second light extraction pattern may be on the insulating layer to correspond to an outer portion of the emission area.

The first light extraction pattern and the second light extraction pattern may each have a closed loop shape in a plan view.

The opening may have a polygonal shape, an elliptical shape, or a circular shape in a plan view.

The first light extraction pattern and the second light extraction pattern may have shapes similar to the opening in a plan view.

A center point in the opening may substantially match center points of the first light extraction pattern and the second light extraction pattern in a plan view.

The display device may further include an intermediate layer on the pixel electrode exposed through the opening, the intermediate layer including an organic light-emitting material; and an opposite electrode facing the pixel electrode with the intermediate layer therebetween, wherein the first light extraction pattern overlaps the intermediate layer.

The display device may further include a touch sensor layer on the opposite electrode; and a cover layer on the touch sensor layer, the first light extraction pattern and the second light extraction pattern may be between the touch sensor layer and the cover layer.

The cover layer may be on the planarization layer.

According to another embodiment, a display device includes an organic light-emitting device on the substrate, the organic light-emitting device including a pixel electrode, an opposite electrode facing the pixel electrode, and an intermediate layer between the pixel electrode and the opposite electrode; an insulating layer defining an emission area via an opening that covers edges of the pixel electrode and exposes a center portion of the pixel electrode; a first light extraction pattern on the insulating layer, the first light extraction pattern having a first height; and a second light extraction pattern surrounding the first light extraction pattern while separating a certain gap from the first light extraction pattern, the second light extraction pattern having a second height that is greater than the first height.

The display device may further include a planarization layer on the first light extraction pattern, the planarization layer covering the first light extraction pattern.

The second light extraction pattern may correspond to the insulating layer.

The first light extraction pattern may have a side surface having a first angle with respect to a lower surface thereof and the second light extraction pattern may have a side surface having a second angle with respect to a lower surface thereof, the second angle being less than the first angle.

The first light extraction pattern may have a first height and the second light extraction pattern may have a second height that is greater than the first height.

The first light extraction pattern and the second light extraction pattern may include a same material.

The first light extraction pattern may have a first refractive index, and the planarization layer may have a second refractive index that is greater than the first refractive index.

The first light extraction pattern and the planarization layer may include a light-transmitting organic material.

The first light extraction pattern may have a closed loop shape in a plan view.

The opening may have a polygonal shape, an elliptical shape, or a circular shape in a plan view, and the first light extraction pattern may have a shape similar to the opening.

A center in a figure of the opening may substantially match a center of a figure of the first light extraction pattern in a plan view.

Other aspects, features and advantages of the disclosure will become better understood through the accompanying drawings, the claims and the detailed description.

According to one or more embodiments of the disclosure, the display device having an improved light-extraction efficiency and reduced color sense variation according to a viewing angle may be implemented. However, the scope of one or more embodiments is not limited to the above effects.

It is to be understood that both the foregoing general description and the following detailed description are exemplary illustrative and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate exemplary illustrative embodiments of the invention, and together with the description serve to explain the inventive concepts.

DETAILED DESCRIPTION

Figure 1:
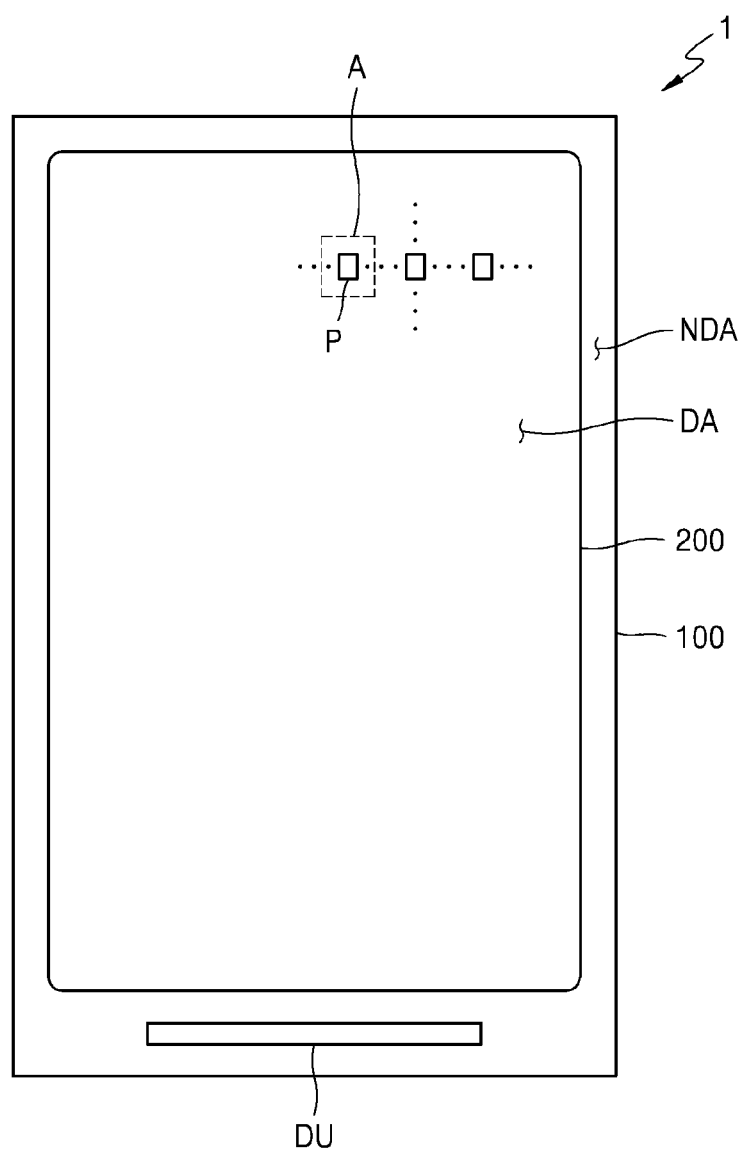
FIG. 1 is a plan view of a display device according to an embodiment.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another. An expression used in the singular encompasses the expression of the plural, unless it has a clearly different meaning in the context.

It will be further understood that the terms "comprises" and/or "comprising" used herein specify the presence of stated features or components, but do not preclude the presence or addition of one or more other features or components. It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 is a plan view of a display device according to an embodiment.

Referring to FIG. 1, the display device 1 according to the embodiment includes a substrate 100 and a display unit 200 on the substrate 100.

The substrate 100 may include various materials such as glass, metal, or an organic material. According to an embodiment, the substrate 100 may include a flexible material. For example, the substrate 100 may include a material that is bendable, foldable, or rollable, e.g., polyimide (PI). However, one or more embodiments are not limited thereto.

The substrate 100 includes a display area DA and a non-display area NDA. The display unit 200 is in the display area DA. The non-display area NDA is at an outer portion of the display area DA, e.g., along a boundary of the substrate 100. A driving unit DU configured to supply signals to the display unit 200 may be at a side in the non-display area NDA.

A plurality of pixels P may be in the display area DA. Each of the pixels P may include a pixel circuit including a thin film transistor electrically connected to a signal line and a power line, a storage capacitor, etc., and a display element connected to the pixel circuit, e.g., an organic light-emitting diode OLED.

Each of the pixels P may emit light, e.g., red light, green light, blue light, or white light, from the organic light-emitting diode OLED. In the specification, the pixel P may emit red light, green light, blue light, or white light, as described above. When the display element in the pixel P is an organic light-emitting diode, the thin film transistor may at least include a driving thin film transistor and a switching thin film transistor.

Figure 2:
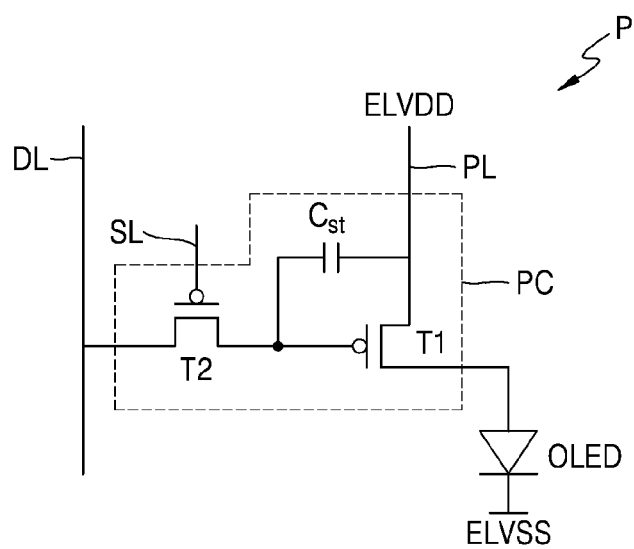
FIG. 2 is an equivalent circuit diagram of one pixel in a display device according to an embodiment.

FIG. 2 is an equivalent circuit diagram of one pixel in a display device according to an embodiment.

Referring to FIG. 2, the pixel P includes a pixel circuit PC and a display element connected to the pixel circuit PC. FIG. 2 shows the organic light-emitting diode OLED as the display element. The pixel circuit PC may include a first thin-film transistor T1, a second thin-film transistor T2, and a storage capacitor Cst.

The second thin film transistor T2 is a switching thin film transistor and is connected to a scan line SL and a data line DL, and may transfer a data voltage input to the data line DL to the first thin film transistor T1 according to a switching voltage input to the scan line SL. The storage capacitor Cst is connected to the second thin-film transistor T2 and a driving voltage line PL and stores a voltage corresponding to a difference between a voltage transferred from the second thin-film transistor T2 and a first power voltage ELVDD supplied to the driving voltage line PL.

The first thin-film transistor T1 is a driving thin-film transistor connected to the driving voltage line PL and the storage capacitor Cst and may control a driving current Id flowing in the organic light-emitting diode OLED from the driving voltage line PL, corresponding to the voltage value stored in the storage capacitor Cst. The organic light-emitting diode OLED may emit light having a certain luminance according to the driving current Id. An opposite electrode (e.g., a cathode) of the organic light-emitting diode OLED may receive supply of a second power voltage ELVSS.

FIG. 2 illustrates that the pixel circuit PC includes two thin film transistors and one storage capacitor, but one or more embodiments are not limited thereto. The number of thin film transistors and the number of storage capacitors may vary depending on a design of the pixel circuit PC.

Figure 3:
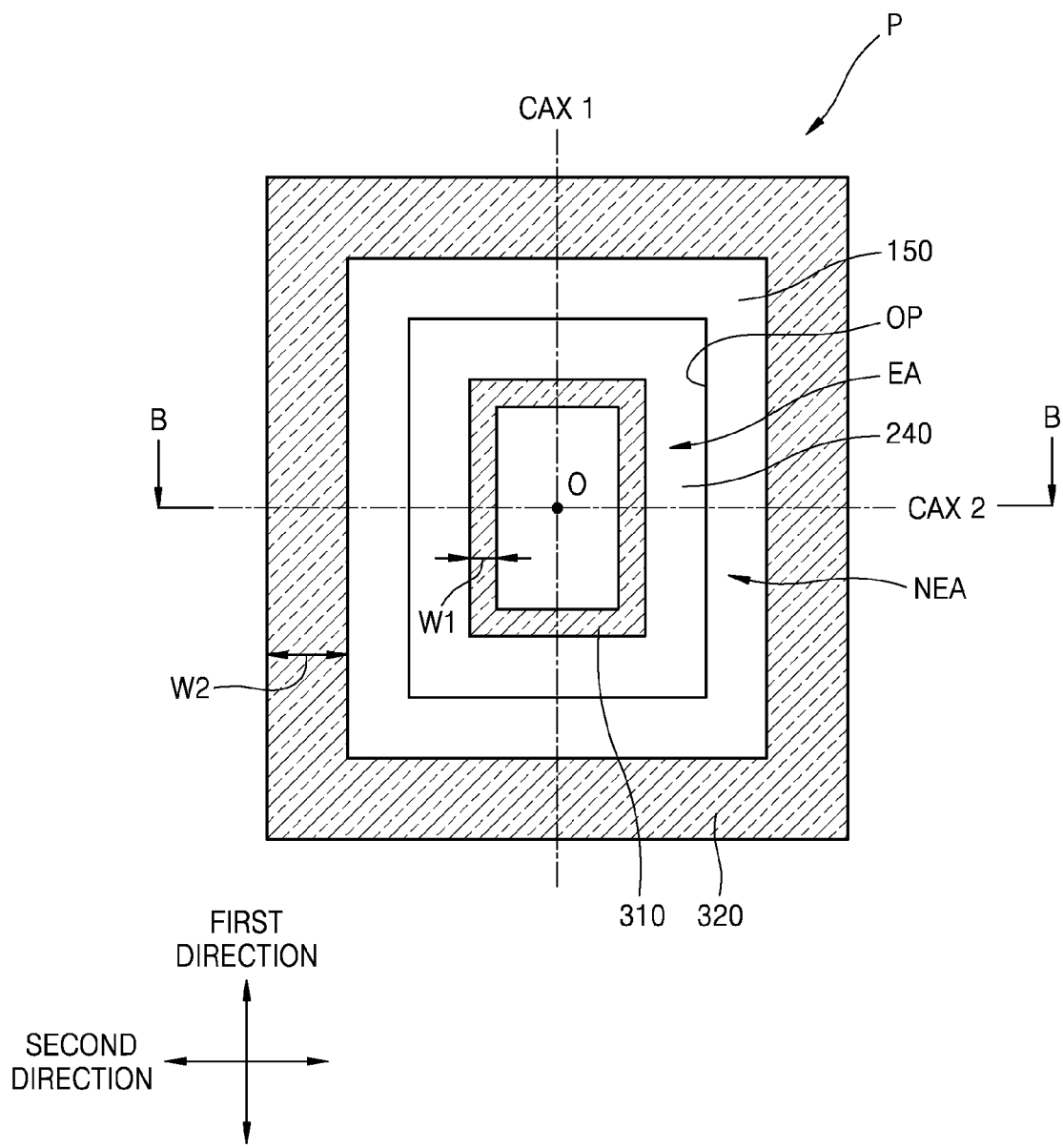
FIG. 3 is a plan view showing an enlarged view of a region A in FIG. 1.

FIG. 3 is a plan view partially showing a display device according to an embodiment. FIG. 3 may correspond to a region A in FIG. 1.

Referring to FIG. 3, each pixel P according to the embodiment includes a light extractor 300 on the organic light-emitting diode OLED. A light extractor 300 (illustrated in FIG. 4) includes a first light extraction pattern 310, a second light extraction pattern 320, and a planarization layer 330 covering the first and second light extraction patterns 310 and 320.

The first and second light extraction patterns 310 and 320 are positioned on a same layer and are also on an insulating layer 150. The insulating layer 150 defines an emission area EA through an opening OP, and the first and second light extraction patterns 310 and 320 are above the opening OP.

In a plan view, the first and second light extraction patterns 310 and 320 have closed loop shapes. In FIG. 3, the first and second light extraction patterns 310 and 320 have frame-like shapes, but are not limited thereto. The first and second light extraction patterns 310 and 320 may have similar shapes to that of the opening OP. In FIG. 3, the opening OP has a quadrangular shape, but may have various shapes, e.g., an octagonal shape as in FIG. 7 or a hexagonal shape as in FIG. 8. Otherwise, the opening OP may have a polygonal shape, an elliptical shape, or a circular shape.

The emission area EA defined by the opening OP may be symmetric about a first axis CAX1 in a first direction and symmetric about a second axis CAX2 in a second direction. The first and second directions may cross each other, e.g., cross each other at a right angle. The first and second light extraction patterns 310 and 320 are each symmetric based on the first axis CAX1 and based on the second axis CAX2.

The first axis CAX1 and the second axis CAX2 meet each other at one point which may be defined as a center point O of a figure. The first and second light extraction patterns 310 and 320 also have the center points O defined in the same manner, and the opening OP and the first and second light extraction patterns 310 and 320 may share the center point O with one another. In an embodiment, when the opening OP has a polygonal shape, the center point O may be defined as a point where two or more diagonal lines connecting two facing corners meet each other in the opening OP.

The first and second light extraction patterns 310 and 320 are on the organic light-emitting diode OLED (illustrated in FIG. 4), and are provided to emit more light from the organic light-emitting diode OLED to the outside. In a comparative example, when the first and second light extraction patterns 310 and 320 are not symmetric based on the first and second axes CAX1 and CAX2, there may be a variation, e.g., the light is more or less reflected from a certain portion in the emission area EA, and this may cause a defect in visibility. Therefore, the first and second light extraction patterns 310 and 320 are symmetric based on the first and second axes CAX1 and CAX2, like in the opening OP.

The first light extraction pattern 310 corresponds to the emission area EA in the opening OP. That is, the first light extraction pattern 310 overlaps the emission area EA in the opening OP, and it may be understood that the first light extraction pattern 310 overlaps an intermediate layer 240 in the opening OP.

The second light extraction pattern 320 corresponds to a non-emission area NEA outside the opening OP. That is, the second light extraction pattern 320 overlaps the non-emission area NEA outside the opening OP, and it may be understood that the second light extraction pattern 320 overlaps the insulating layer 150. Because a region from which the insulating layer 150 is removed is defined as the opening OP, that is, the emission area EA, and a region from which the insulating layer 150 is not removed is defined as the non-emission area NEA, it may be understood that the first light extraction pattern 310 is on the emission areas EA and the second light extraction pattern 320 is on the non-emission area NEA.

The first light extraction pattern 310 has a first width W1, and the second light extraction pattern 320 has a second width W2. Here, the second width W2 may be greater than the first width W1. This relates to an angle between side surfaces of the first light extraction pattern 310 and the second light extraction pattern 320 and a light-extraction efficiency according to the positions of the first light extraction pattern 310 and the second light extraction pattern 320. This will be described in detail below with reference to FIGS. 4 and 5.

Figure 4:
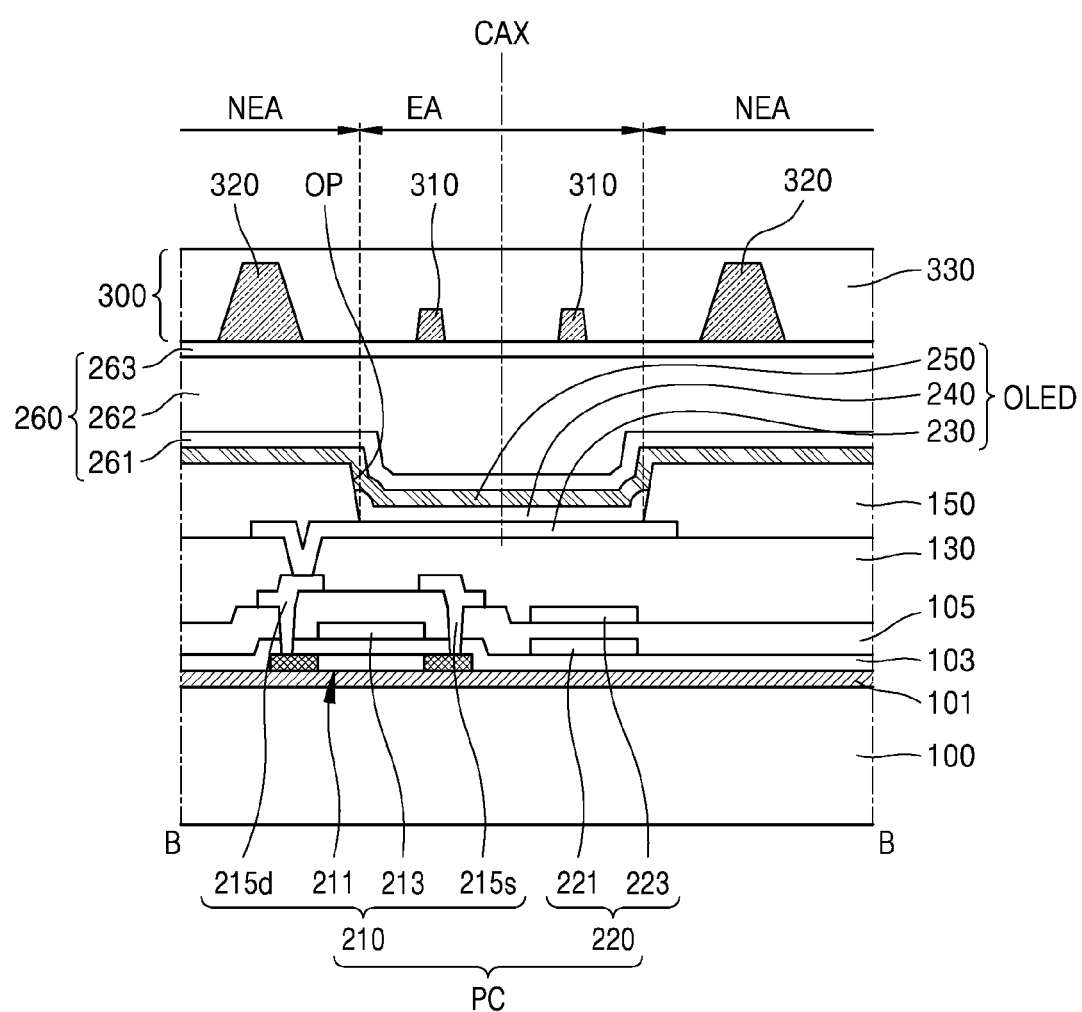
FIG. 4 is a cross-sectional view of the display device taken along line B-B of FIG. 3.
Figure 5:
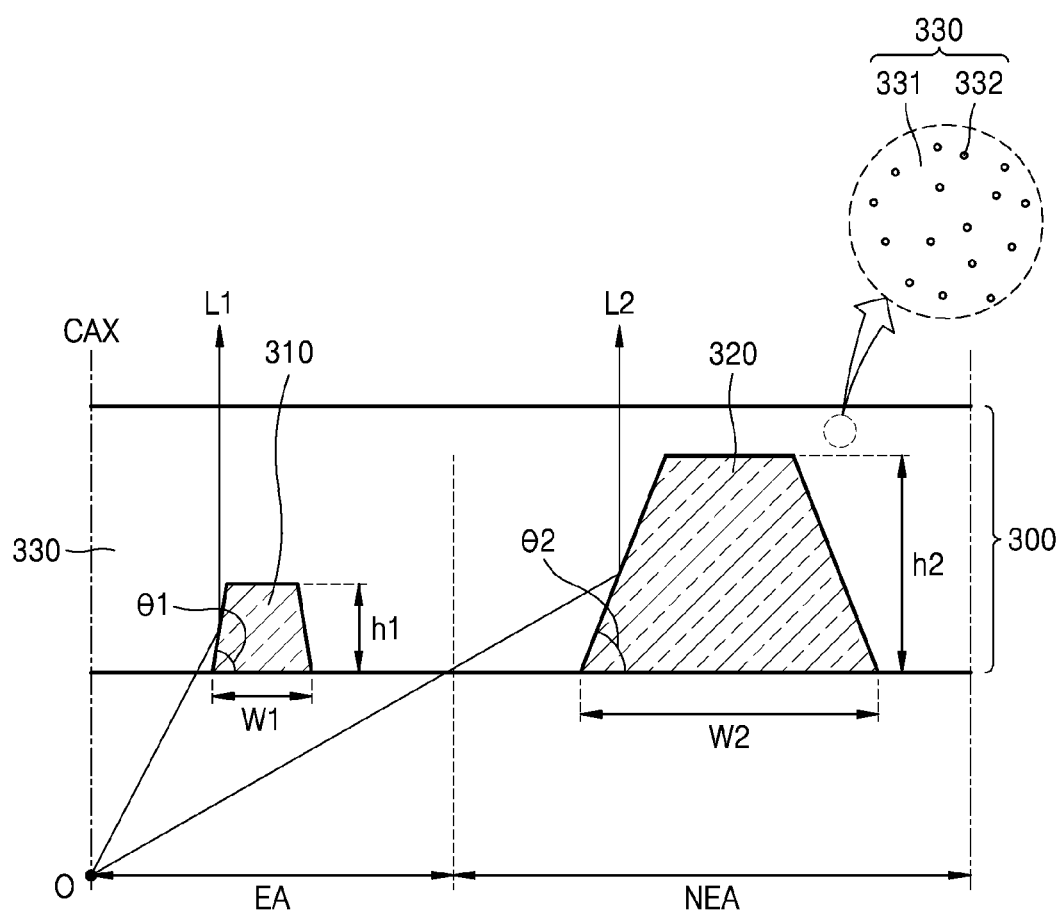
FIG. 5 is a cross-sectional view of a pixel in a display device according to another embodiment.

FIG. 4 is a cross-sectional view partially showing the display device according to an embodiment, and FIG. 5 is a cross-sectional view of a pixel in the display device according to another embodiment. FIG. 4 may show a cross-section of the display device taken along line B-B of FIG. 3.

Referring to FIG. 4, the pixel P in the display area DA includes a pixel circuit PC including a thin film transistor 210 and a storage capacitor 220. The thin film transistor 210 of FIG. 4 may be the first thin film transistor T1 that is a driving thin film transistor in FIG. 2.

The pixel circuit PC may include a buffer layer 101, a gate insulating layer 103, and an interlayer insulating layer 105 that are sequentially on the substrate 100.

The buffer layer 101 is on the substrate 100 in order to prevent infiltration of impurities, and the gate insulating layer 103 may be between a semiconductor layer 211 and a gate electrode 213 of the thin film transistor 210. The interlayer insulating layer 105 is between the gate electrode 210 and a source electrode 215s and a drain electrode 215d of the thin film transistor 210, and at the same time, may be between a lower electrode 221 and an upper electrode 223 of the storage capacitor 220 to function as a dielectric material.

The buffer layer 101, the gate insulating layer 103, and the interlayer insulating layer 105 may include an insulating interlayer material. For example, the buffer layer 101, the gate insulating layer 103, and the interlayer insulating layer 105 may each include silicon nitride, silicon oxide, and/or silicon oxynitride.

FIG. 4 shows an example, in which the thin film transistor 210 of the pixel circuit PC is a top-gate type, but one or more embodiments are not limited thereto. In another embodiment, the thin film transistor 210 may be of a bottom-gate type. Also, FIG. 4 describes that the lower electrode 221 and the upper electrode 223 of the storage capacitor 220 are disposed on the same respective layers and include the same material as those of the gate electrode 213 and the source and drain electrodes 215s and 215d, but one or more embodiments are not limited thereto.

The organic light-emitting diode OLED includes a pixel electrode 230, an opposite electrode 250 facing the pixel electrode 230, and an intermediate layer 240 between the pixel electrode 230 and the opposite electrode 250, wherein the pixel electrode 230 is electrically connected to the pixel circuit PC with a via layer 130 having a contact hole therebetween. In an embodiment, the via layer 130 may include an insulating organic material.

The pixel electrode 230 is exposed through the opening OP in the insulating layer 150 that is understood as a pixel defining layer, and edges of the pixel electrode 230 may be covered by the insulating layer 150 including an insulating organic material. In an embodiment, the pixel electrode 230 may include argentum (Ag), magnesium (Mg), aluminum (Al), platinum (Pt), palladium (Pd), aurum (Au), nickel (Ni), neodymium (Nd), iridium (Ir), chromium (Cr), or a compound thereof.

The opposite electrode 250 is integrally provided to entirely cover the display area DA. In an embodiment, the opposite electrode 250 may include a thin film metal layer including argentum (Ag) and magnesium (Mg), or a transparent conductive oxide (TCO) such as indium tin oxide (ITO), indium zinc oxide (IZO), zinc oxide (ZnO), indium oxide (In2O3), indium gallium oxide (IGO), or aluminum zinc oxide (AZO).

The intermediate layer 240 may include an organic material including a fluorescent or phosphor material emitting red light, green light, and blue light, and may be patterned to correspond to the pixels P in the display area DA.

Although not shown in the drawings, at least one of a first functional layer (not shown) between the intermediate layer 240 and the pixel electrode 230 and a second functional layer (not shown) between the intermediate layer 240 and the opposite electrode 250 may be provided with the intermediate layer 240 therebetween. The first functional layer and the second functional layer may be common layers provided entirely on the display unit 200, unlike the intermediate layer 240 patterned on the pixel electrode 230.

The first functional layer may include, for example, at least one of a hole injection layer (HIL) and a hole transport layer (HTL). The HIL allows holes to be easily emitted from an anode, and the HTL allows holes from the HIL to be transferred to an emission layer. The second functional layer may include at least one of an electron transport layer (ETL) and an electron injection layer (EIL). The EIL makes electrons be easily emitted from a cathode, and the ETL makes electrons from the EIL be transferred to the emission layer.

An encapsulation layer 260 is in the display area DA. FIG. 4 shows the encapsulation layer 260 on the display area DA, but the encapsulation layer 260 may be partially on the non-display area NDA.

In another embodiment, an encapsulation substrate (not shown) may be on the substrate 100 instead of the encapsulation layer. In such case the substrate 100 and the encapsulation substrate may be bonded to each other via a sealant (not shown) on an outer portion of the substrate 100 to seal the display unit 200. In the embodiment, a structure of sealing the display unit 200 via the encapsulation layer 260 will be described below.

The encapsulation layer 260 includes first and second inorganic layers 261 and 263 and an organic layer 262. For example, the encapsulation layer 260 may include a structure in which the first inorganic layer 261, the organic layer 262, and the second inorganic layer 263 are sequentially stacked. The first and second inorganic layers 261 and 263 may include at least one material selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The first and second inorganic layers 261 and 263 may be obtained by, for example, a chemical vapor deposition (CVD) process.

The organic layer 262 may include at least one material selected from the group consisting of an acryl-based resin, methacrylic resin, polyisoprene, vinyl-based resin, epoxy-based resin, urethane-based resin, cellulose-based resin, and perylene-based resin.

In an embodiment, the organic layer 262 may be obtained by an atomic layer deposition (ALD) process using a material such as hexamethyldisiloxane (HMDSO) or tetraethyl orthosilicate (TEOS) as a source gas.

In another embodiment, the organic layer 262 may be obtained by depositing liquid monomer and curing the monomer by using heat or light such as ultraviolet rays.

In the embodiment, the encapsulation layer 260 includes two inorganic layers, e.g., first and second inorganic layers 261 and 263, and one organic layer 262, but the stack order of the inorganic encapsulation layers and the organic encapsulation layers and the numbers of inorganic encapsulation layers and organic encapsulation layers are not limited thereto.

The light extractor 300 may be on the encapsulation layer 260. In some embodiments, the light extractor 300 is on the encapsulation layer 260, but in other embodiments, various functional layers may be between the light extractor 300 and the encapsulation layer 260, and the light extractor 300 may be on the functional layers. The functional layers may include, for example, a touch sensor layer, a polarization layer, a filter layer, an organic layer, an inorganic layer, etc.

The light extractor 300 includes a first light extraction pattern 310, a second light extraction pattern 320, and a planarization layer 330 covering the first and second light extraction patterns 310 and 320. The first and second light extraction patterns 310 and 320 are at the same layer, and the planarization layer 330 covers the first and second light extraction patterns 310 and 320. The planarization layer 330 planarizes upper surfaces of the first and second light extraction patterns 310 and 320 such that a window cover (not shown), etc. may be provided thereon.

Referring to FIGS. 4 and 5, the first light extraction pattern 310 is on the emission area EA that is defined by the opening OP of the insulating layer 150, and the second light extraction pattern 320 is on the non-emission area NEA outside the opening OP. As shown in FIG. 4, the first and second light extraction patterns 310 and 320 are symmetric based on a center axis CAX that passes through the center of the emission area EA. The center axis CAX may correspond to the first axis CAX1 of FIG. 3.

Referring to FIG. 5, the first and second light extraction patterns 310 and 320 have a first refractive index and the planarization layer 330 has a second refractive index. Here, the second refractive index of the planarization layer 330 is greater than the first refractive index of the first and second light extraction patterns 310 and 320. That is, a refractive index of a material included in the planarization layer 330 is greater than that of a material included in the first and second light extraction patterns 310 and 320. According to the above characteristics, light emitted from the organic light-emitting diode OLED is totally reflected by surfaces of the first and second light extraction patterns 310 and 320 and then is emitted to the front of the OLED, and thus, the light emission efficiency may be improved.

The first and second light extraction patterns 310 and 320 and the planarization layer 330 include, for example, light-transmitting organic materials. Because the light extractor 300 is provided to improve the light-emission efficiency of the organic light-emitting diode OLED and the display device according to the embodiment is presumed to be of a top-emission type, the elements in the light extractor 300 include light-transmitting materials. For example, the first and second light extraction patterns 310 and 320 and the planarization layer 330 may include an acryl-based organic layer, but one or more embodiments are not limited thereto. That is, any kind of light-transmitting organic material may be used provided that the refractive index of the planarization layer 330 is greater than that of the first and second light extraction patterns 310 and 320.

In an embodiment, the planarization layer 330 having a relatively high refractive index may include a material, in which fine particles 332 are dispersed in an organic material 331, to improve the refractive index. The fine particles 332 may include an inorganic material such as zirconia.

A side surface of the first light extraction pattern 310 has an inclination of a first angle (θ1) and a side surface of the second light extraction pattern 320 has an inclination of a second angle (θ2). Here, the first angle (θ1) is greater than the second angle (θ2). For example, the first angle (θ1) may be in a range of about 70° to about 90° and the second angle (θ2) may be in a range of about 70° to about 80°. In FIG. 5, the first and second light extraction patterns 310 and 320 may each have a trapezoidal shape, but embodiments are not limited thereto. The first light extraction pattern 310 may have a rectangular shape. The first and second angles (θ1 and θ2) of the first and second light extraction patterns 310 and 320 may be designed taking into account a size of the pixel P, a thickness of the light extractor 300, etc.

As shown in FIG. 5, light emitted from the center of the emission area EA is totally reflected on the side surfaces of the first and second light extraction patterns 310 and 320 and emitted to the front of the organic light-emitting diode OLED. When a user uses the display device, the display device and the eyes of the user are mostly located on a straight line. Thus, it is an important element in the performance of the display device whether the light from the organic light-emitting diode OLED emits to the front of the OLED. Accordingly, the display device according to the embodiment includes the first and second light extraction patterns 310 and 320 on the organic light-emitting diode OLED such that a front emission efficiency of the light from the organic light-emitting diode OLED may be improved. Thus, the performance and lifespan of the display device may be noticeably improved.

FIG. 5 shows the light emitted from the center of the emission area EA as first light L1 and second light L2 according to angles. The second light L2 has a greater angle with the center axis CAX than that of the first light L1 and proceeds toward the non-emission area NEA. Because the second light L2 does not proceed straightforward to the front surface of the organic light-emitting diode OLED, when the first and second light extraction patterns 310 and 320 are not provided as in a comparative example, the second light L2 mixes with the color of adjacent pixels or may degrade the optical efficiency of the organic light-emitting diode OLED. Therefore, when the second light extraction pattern 320 is provided on the non-emission area NEA, the second light L2 proceeding toward the non-emission area NEA may be emitted to the front, to thereby improve the light-emission efficiency.

As described above, the second light L2 proceeds toward the non-emission area NEA and has a relatively large angle with respect to the center axis CAX, and thus, the angle of the side surface of the second light extraction pattern 320 is less than that of the first light extraction pattern 310 considering the incident angle. Similarly, because the first light L1 proceeds toward the emission area EA and has a relatively small angle with respect to the center axis CAX, the angle of the side surface of the first light extraction pattern 310 is greater than that of the second light extraction pattern 320 considering the incident angle.

Although the first light L1 proceeds toward the emission area EA, the first light L1 is not emitted to the front when the first light extraction pattern 310 is not provided as a comparative example. Therefore as described herein, the first light extraction pattern 310 is provided on the emission area EA, and thus, the first light L1 may be emitted to the front and the light-emission efficiency may be improved.

The first light extraction pattern 310 has a first height h1, and the second light extraction pattern 320 has a second height h2. The first height h1 of the first light extraction pattern 310 is less than the second height h2 of the second light extraction pattern 320. Because the first light extraction pattern 310 is on the emission area EA, the first light extraction pattern 310 may be relatively thin in terms of light efficiency.

According to the same principle, the first light extraction pattern 310 has the first width W1 and the second light extraction pattern 320 has the second width W2. Here, the first width W1 of the first light extraction pattern 310 is less than the second width W2 of the second light extraction pattern 320. As described above, even when the first light extraction pattern 310 includes the light-transmitting material, the light efficiency may degrade when a structure is on the emission area EA. Therefore, the first light extraction pattern 310 on the emission area EA has a width less than that of the second light extraction pattern 320 on the non-emission area NEA, and thus, degradation of the light efficiency of the emission area EA due to the first light extraction pattern 310 may be reduced. For example, the first width W1 of the first light extraction pattern 310 may be about 10% to about 30% of the emission area EA in the same direction, but is not limited thereto.

Figure 6:
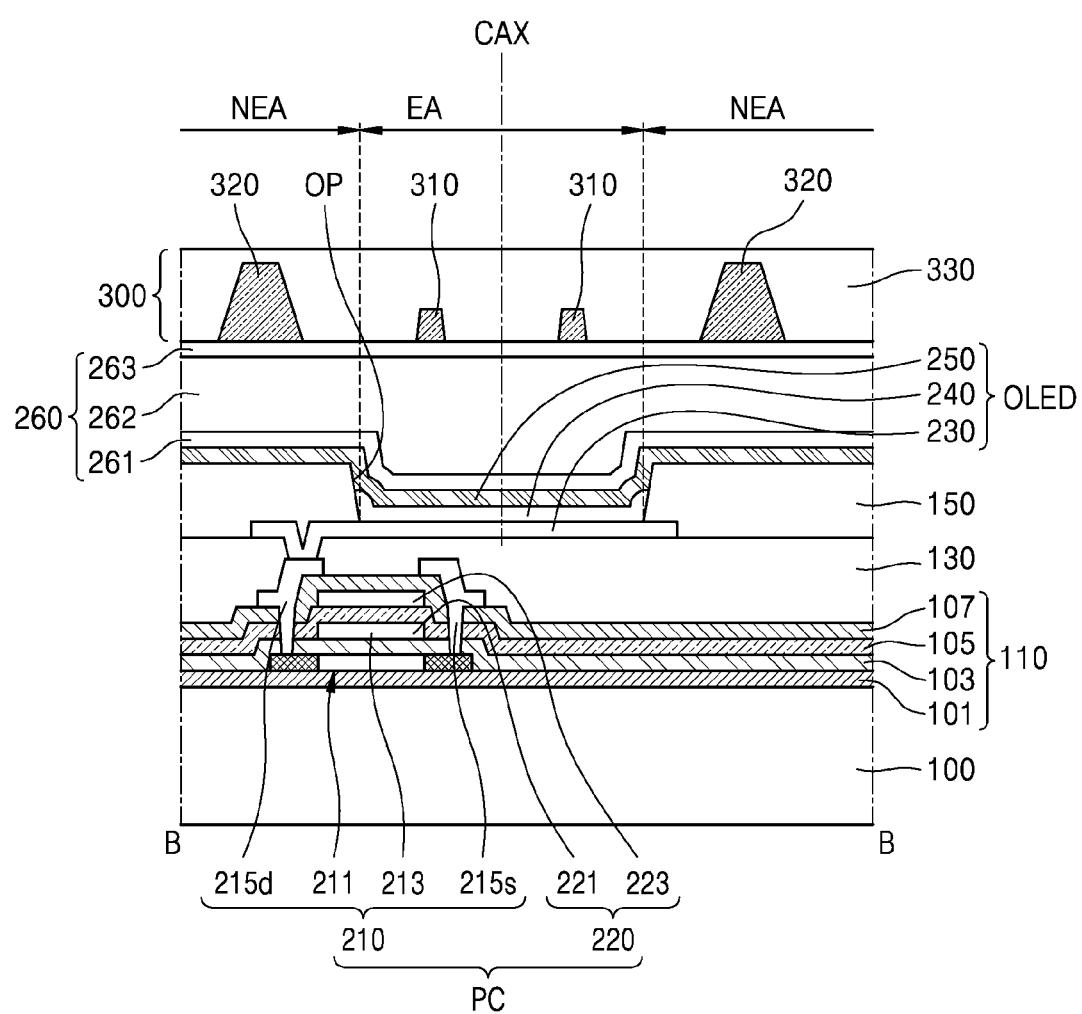
FIG. 6 is a cross-sectional view of a pixel in a display device according to another embodiment.

FIG. 6 is a cross-sectional view of a pixel in a display device according to another embodiment.

The embodiment of FIG. 6 is different from that of FIG. 4 in view of a structure of the pixel circuit PC. Other components are the same as those of FIG. 4, and differences between the structures of the pixel circuit PC will be described below.

Referring to FIG. 6, the pixel circuit PC includes the thin film transistor 210 and the storage capacitor 220. A pixel circuit layer 110 may include a buffer layer 101, a gate insulating layer 103, a dielectric insulating layer 105, an interlayer insulating layer 107, and an inorganic protective layer 109 sequentially on the substrate 100.

The buffer layer 101 is on the substrate 100 in order to prevent infiltration of impurities. The gate insulating layer 103 is between the semiconductor layer 211 and the gate electrode 213 of the thin film transistor 210. The dielectric insulating layer 105 is between the lower electrode 221 and the upper electrode 223 of the storage capacitor 220, and the interlayer insulating layer 107 is between the gate electrode 213 and the source and drain electrodes 215s and 215d of the thin film transistor 210.

The buffer layer 101, the gate insulating layer 103, the dielectric insulating layer 105, the interlayer insulating layer 107, and the inorganic protective layer 109 all include an insulating inorganic material. For example, the buffer layer 101, the gate insulating layer 103, the dielectric insulating layer 105, the interlayer insulating layer 107, and the inorganic protective layer 109 may each include silicon nitride, silicon oxide, and/or silicon oxynitride.

In FIG. 6, the thin film transistor 210 and the storage capacitor 220 overlap each other, and thus, the gate electrode 213 of the thin film transistor 210 functions as the lower electrode 221 of the storage capacitor 220, but one or more embodiments are not limited thereto.

Figure 7:
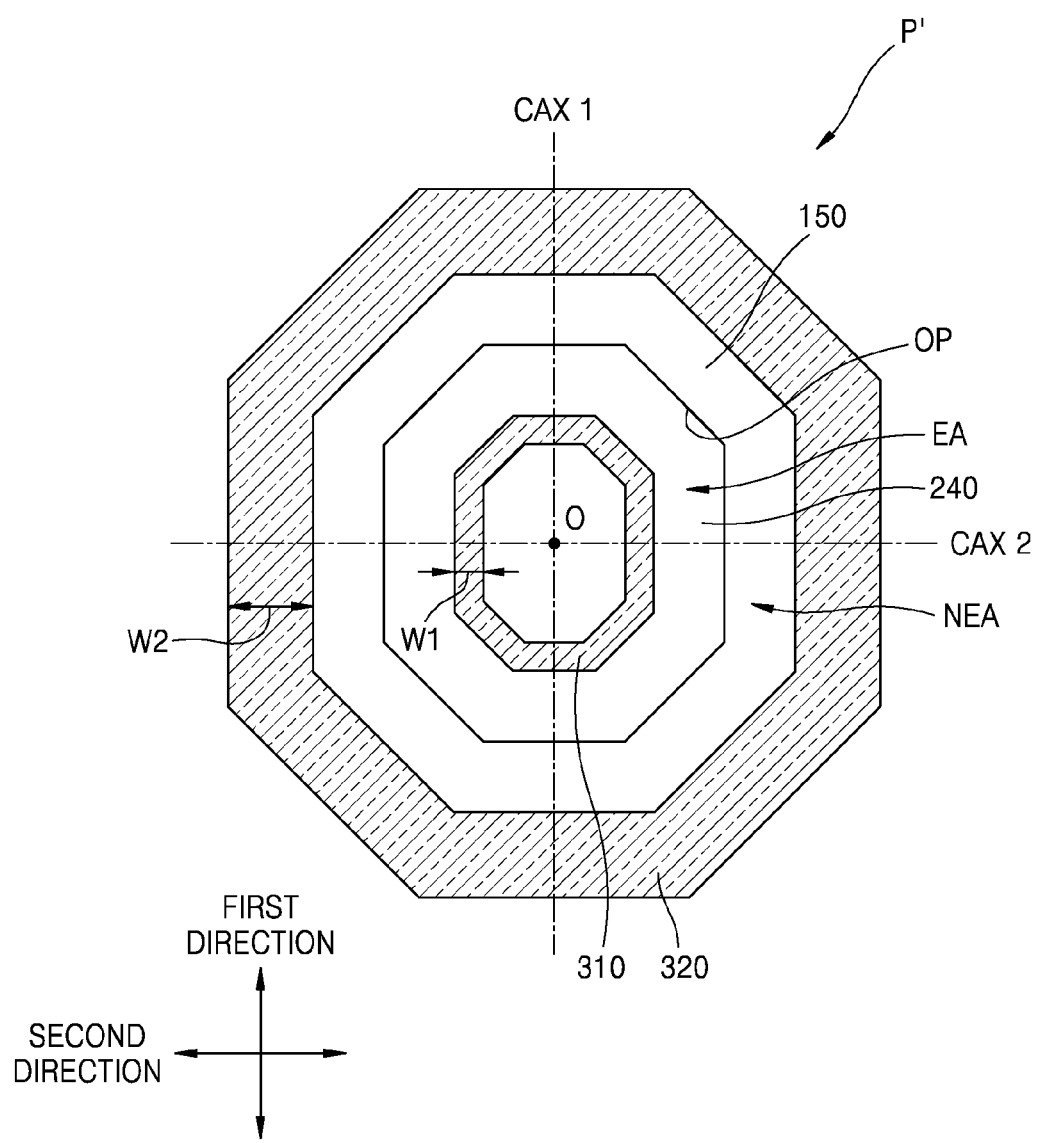
FIGS. 7 and 8 are plan views of a pixel in a display device according to another embodiment.
Figure 8:
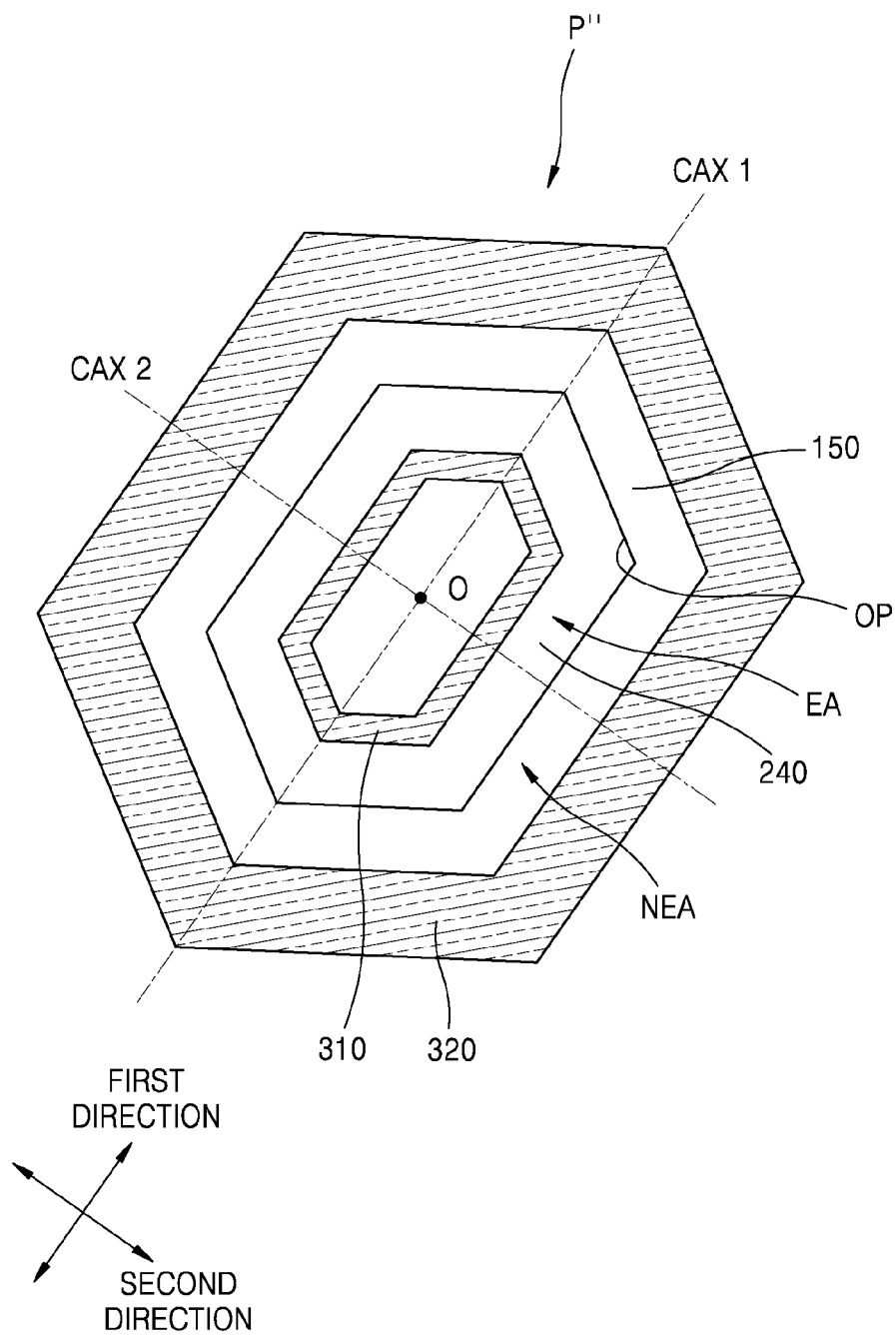

FIGS. 7 and 8 are plan views of one pixel in a display device according to another embodiment, and show a modified example of FIG. 3.

In FIG. 3 above, the emission area EA defined by the opening OP has a quadrangular shape, and FIGS. 7 and 8 show cases in which the emission area EA defined by the opening OP has an octagonal shape and a hexagonal shape as modified examples. The embodiments shown in FIGS. 7 and 8 are the same as the embodiment of FIG. 3 except for the shape of the opening OP, and differences will be described below.

Referring to FIG. 7, the emission area EA of a pixel P' defined by the opening OP may have an octagonal shape. The emission area EA is symmetric based on the first axis CAX1 in the first direction and based on the second axis CAX2 crossing the first axis CAX1. The first and second light extraction patterns 310 and 320 are similar to the shape of the opening OP. Like in FIG. 3, the first light extraction pattern 310 is on the emission area EA and the second light extraction pattern 320 is on the non-emission area NEA.

Referring to FIG. 8, the emission area EA of a pixel P" defined by the opening OP may have an octagonal shape. The emission area EA is symmetric based on the first axis CAX1 in the first direction and based on the second axis CAX2 crossing the first axis CAX1. The first and second directions in FIG. 8 may be diagonal as compared with those of FIG. 7. That is, the arrangement of the pixel P'" may be provided in a Pentile type, as well as a stripe type, and in this case, the shape of the pixel P'" as in FIG. 8 may be used. Likewise, the first and second light extraction patterns 310 and 320 are similar to the shape of the opening OP. The first light extraction pattern 310 is on the emission area EA, and the second light extraction pattern 320 is on the non-emission area NEA.

Figure 9:
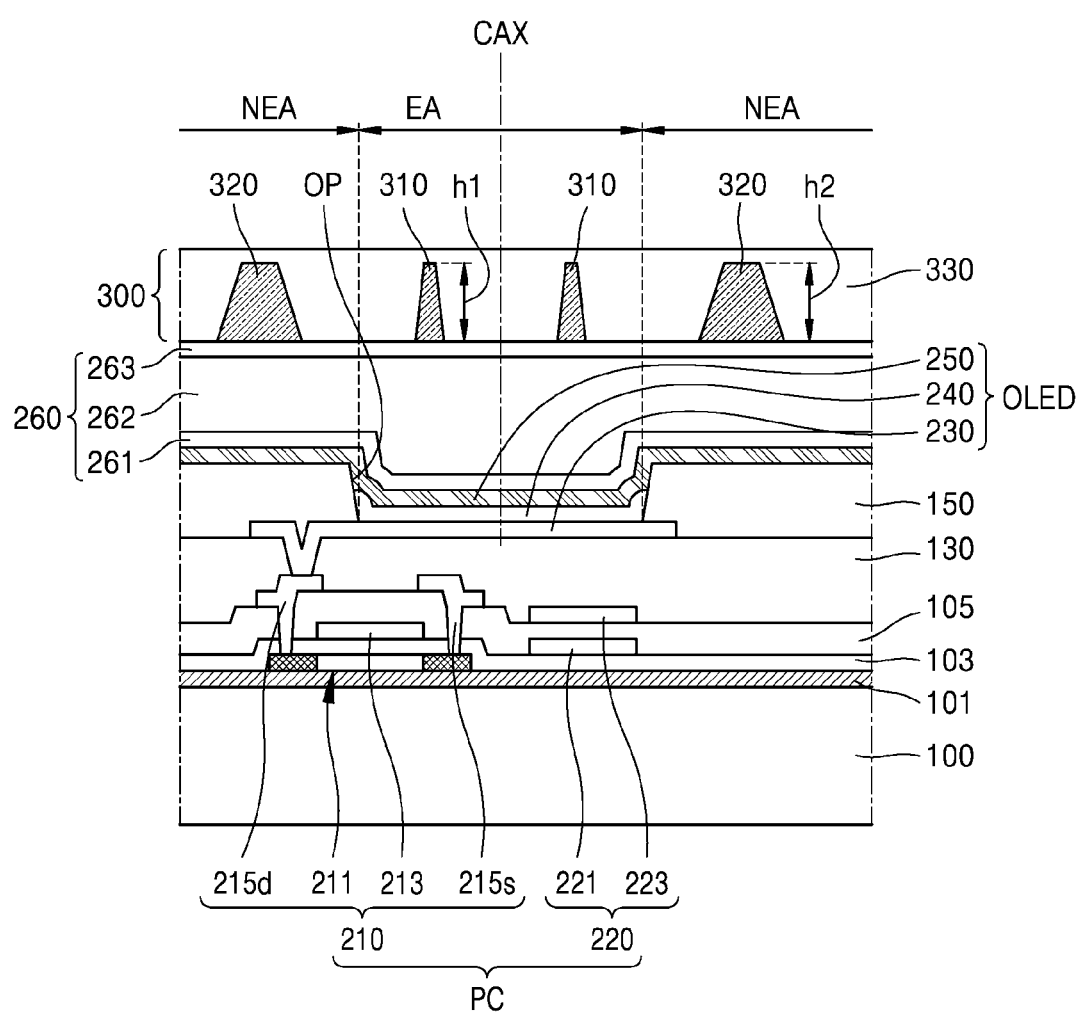
FIG. 9 is a cross-sectional view of a pixel in a display device according to another embodiment.
Figure 10:
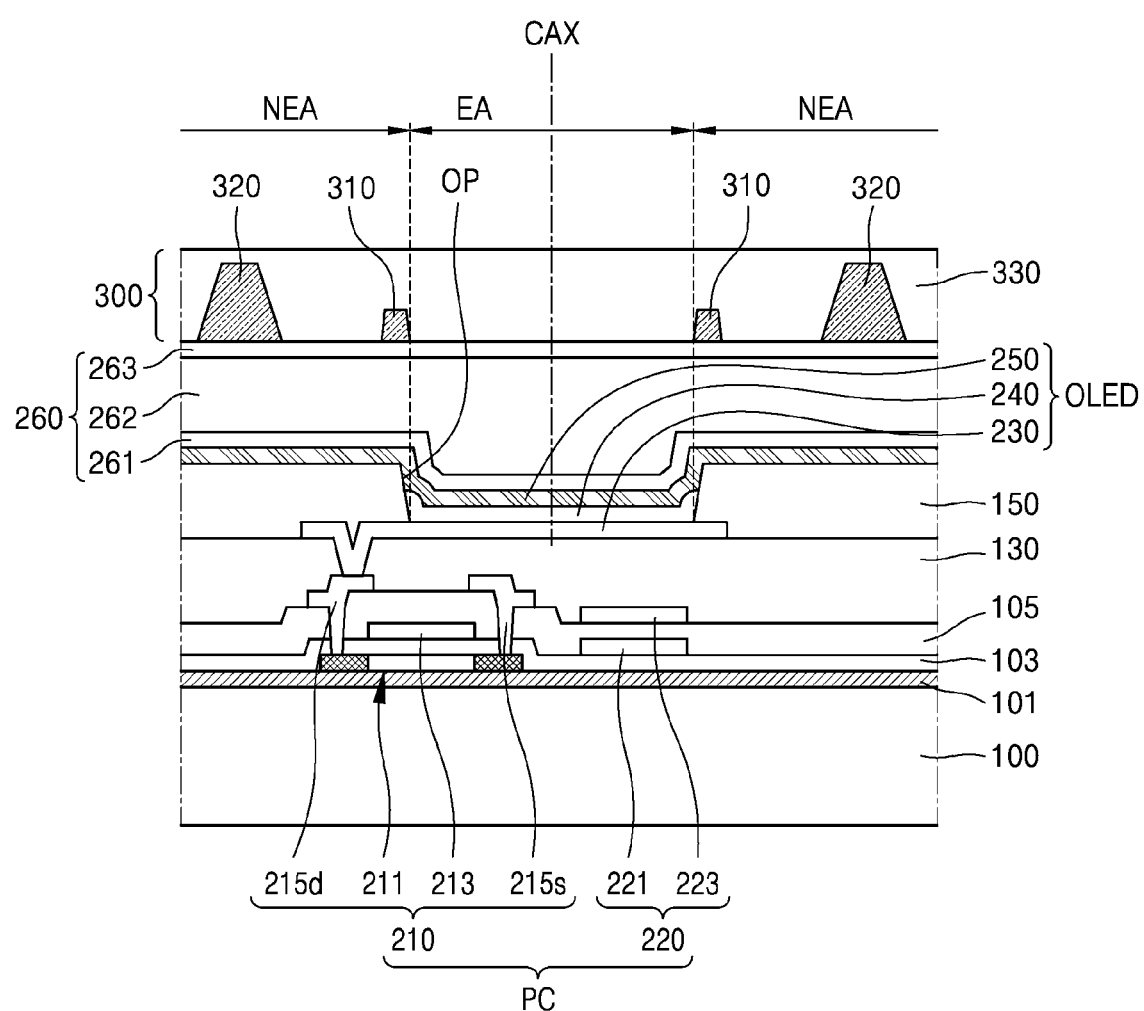
FIG. 10 is a cross-sectional view of a pixel in a display device according to another embodiment.

FIGS. 9 and 10 are cross-sectional views of one pixel according to another embodiment, and show modified examples of the embodiment shown in FIG. 4.

The embodiments of FIGS. 9 and 10 are different from that of FIG. 4 in view of a structure of the light extractor 300. Other components are the same as those of FIG. 4, and differences between the structures of the light extractor 300 will be described below.

Referring to FIG. 9, the first height h1 of the first light extraction pattern 310 and the second height h2 of the second light extraction pattern 320 may be equal to each other. In the embodiment of FIG. 4, the first height h1 of the first light extraction pattern 310 is less than the second height h2 of the second light extraction pattern 320, and this relates to an issue of manufacturing processes, besides the optical efficiency of the emission area EA. That is, because the side surface angle of the first light extraction pattern 310 is designed to be nearly around 90°, it may be difficult to make the first light extraction pattern 310 have greater height than that of the second light extraction pattern 320 having a relatively small side surface angle. Also, there is a limitation in increasing the width of the first light extraction pattern 310 for improving the emission area EA, and thus, in the embodiment of FIG. 4, the light extractor 300 is designed such that the height of the first light extraction pattern 310 is decreased.

Therefore, when processing conditions are allowable, the first height h1 of the first light extraction pattern 310 may be equal to the second height h2 of the second light extraction pattern 320 as shown in FIG. 9.

Referring to FIG. 10, the first and second light extraction patterns 310 and 320 may be disposed in the non-emission area NEA. In this case, the first height h1 of the first light extraction pattern 310 located inside may be less than the second height h2 of the second light extraction pattern 320 located outside. As such, in the light proceeding toward the non-emission area NEA, the light that is not reflected by the first light extraction pattern 310 may be reflected by the second light extraction pattern 320, and thus, the front light-emission efficiency of the organic light-emitting diode OLED may be improved.

Figure 11:
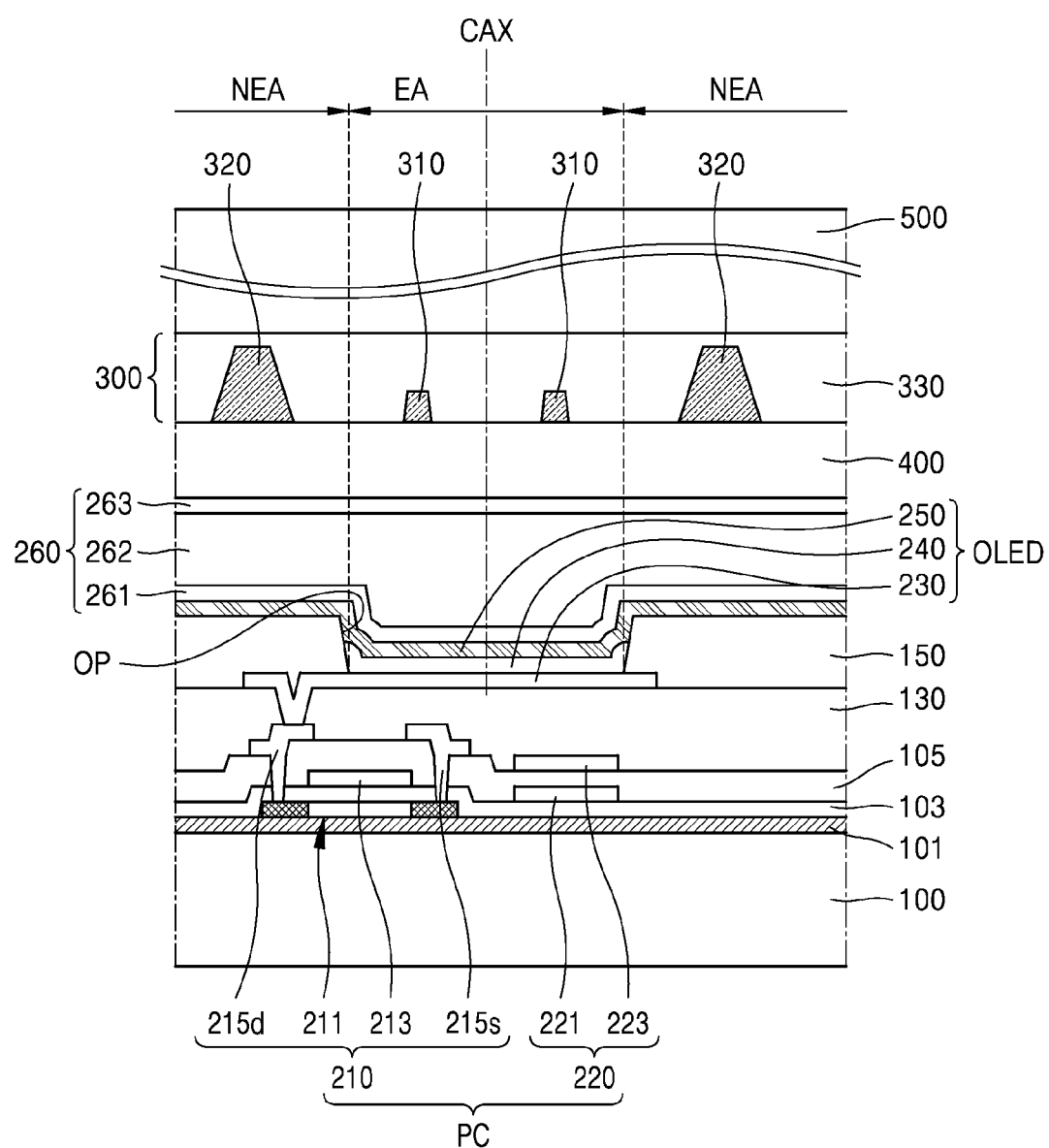
FIG. 11 is a cross-sectional view of a pixel in a display device according to another embodiment.

FIG. 11 is a cross-sectional view of a pixel in a display device according to another embodiment and shows a modified example of the embodiment shown in FIG. 4.

The embodiment of FIG. 11 is different from the embodiment of FIG. 4 in view of an upper structure of the encapsulation layer 260. Other components are the same as those of FIG. 4, and differences between the upper structures of the encapsulation layer 260 will be described below.

Referring to FIG. 11, the display device according to the embodiment includes the light extractor 300, the touch sensor layer 400, and the cover layer 500. The light extractor 300 may be between the touch sensor layer 400 and the cover layer 500.

The touch sensor layer 400 electrically or physically senses a touch input from the user and transfers the touch input to the display unit as an electrical signal. In an embodiment, the touch sensor layer 400 may be directly on the encapsulation layer 260. That is, sensing patterns and an insulating layer, etc. of the touch sensor layer 400 may be directly on the encapsulation layer 260. In another embodiment, the touch sensor layer 400 may be laminated on the encapsulation layer 260 in the form of a touch panel. Here, the touch sensor layer 400 may be on the encapsulation layer 260 via an adhesive layer (not shown).

The light extractor 300 may be on the touch sensor layer 400. The cover layer 500 corresponding to a cover window may be on the light extractor 300.

The display device has been described, but one or more embodiments of the disclosure are not limited thereto. For example, a method of manufacturing the display device may be also included in the scope of the disclosure.

While the disclosure has been particularly shown and described with reference to exemplary embodiments thereof, it will be understood by those of ordinary skill in the art that various changes in form and details may be made therein without departing from the spirit and scope as defined by the following claims. Therefore, the scope sought to be protected of the disclosure shall be defined by the appended claims.

The invention claimed is:

1. A display device comprising:
a pixel electrode on a substrate;
an insulating layer defining an emission area via an opening that covers edges of the pixel electrode and exposes a center portion of the pixel electrode;
a first light extraction pattern on the pixel electrode, the first light extraction pattern having a side surface inclined at a first angle; and
a second light extraction pattern surrounding the first light extraction pattern on an outer portion of the first light extraction pattern, the second light extraction pattern having a side surface inclined at a second angle that is less than the first angle.

2. The display device of claim 1, further comprising:
a planarization layer covering the first light extraction pattern and the second light extraction pattern.

3. The display device of claim 2, wherein the first light extraction pattern and the second light extraction pattern have a first refractive index, and the planarization layer has a second refractive index that is greater than the first refractive index.

4. The display device of claim 2, wherein the first light extraction pattern, the second light extraction pattern, and the planarization layer include a light-transmitting organic material.

5. The display device of claim 2, wherein the planarization layer includes fine particles including an inorganic material.

6. The display device of claim 1, wherein the second light extraction pattern has a second height and the first light extraction pattern has a first height that is less than the second height.

7. The display device of claim 1, wherein the first light extraction pattern has a first height and the second light extraction pattern has a second height that is equal to the first height.

8. The display device of claim 1, wherein the first light extraction pattern is on the opening to correspond to the emission area.

9. The display device of claim 8, wherein the second light extraction pattern is on the insulating layer to correspond to an outer portion of the emission area.

10. The display device of claim 1, wherein the first light extraction pattern and the second light extraction pattern each have a closed loop shape in a plan view.

11. The display device of claim 10, wherein the opening has a polygonal shape, an elliptical shape, or a circular shape in a plan view.

12. The display device of claim 10, wherein the first light extraction pattern and the second light extraction pattern have shapes similar to the opening in a plan view.

13. The display device of claim 10, wherein a center point in the opening substantially matches center points of the first light extraction pattern and the second light extraction pattern in a plan view.

14. The display device of claim 1, further comprising:
an intermediate layer on the pixel electrode exposed through the opening, the intermediate layer including an organic light-emitting material; and
an opposite electrode facing the pixel electrode with the intermediate layer therebetween,
wherein the first light extraction pattern overlaps the intermediate layer.

15. The display device of claim 14, further comprising:
a touch sensor layer on the opposite electrode; and
a cover layer on the touch sensor layer,
wherein the first light extraction pattern and the second light extraction pattern are between the touch sensor layer and the cover layer.

16. The display device of claim 15, wherein the cover layer is on the planarization layer.

17. A display device comprising:
an organic light-emitting device on the substrate, the organic light-emitting device including a pixel electrode, an opposite electrode facing the pixel electrode, and an intermediate layer between the pixel electrode and the opposite electrode;
an insulating layer defining an emission area via an opening that covers edges of the pixel electrode and exposes a center portion of the pixel electrode;
a first light extraction pattern on the insulating layer, the first light extraction pattern having a first height; and
a second light extraction pattern surrounding the first light extraction pattern with a certain gap of separation from the first light extraction pattern, the second light extraction pattern having a second height that is greater than the first height.

18. The display device of claim 17, wherein the second light extraction pattern corresponds to the insulating layer.

19. The display device of claim 18, wherein the first light extraction pattern has a first refractive index, and the planarization layer has a second refractive index that is greater than the first refractive index.

20. The display device of claim 17, wherein the first light extraction pattern has a side surface having a first angle with respect to a lower surface thereof and the second light extraction pattern has a side surface having a second angle with respect to a lower surface thereof, the second angle being less than the first angle.

21. The display device of claim 17, wherein the first light extraction pattern has a first height and the second light extraction pattern has a second height that is greater than the first height.

22. The display device of claim 17, wherein the first light extraction pattern and the second light extraction pattern include a same material.

23. The display device of claim 17, further comprising a planarization layer on the first light extraction pattern, the planarization layer covering the first light extraction pattern.

24. The display device of claim 23, wherein the first light extraction pattern and the planarization layer include a light-transmitting organic material.

25. The display device of claim 23, wherein the first light extraction pattern has a closed loop shape in a plan view.

26. The display device of claim 17, wherein the opening has a polygonal shape, an elliptical shape, or a circular shape in a plan view, and the first light extraction pattern has a shape similar to the opening.

27. The display device of claim 17, wherein a center in a figure of the opening substantially matches a center of a figure of the first light extraction pattern in a plan view.

* * * * *